US00RE39273E

(19) United States
(12) Reissued Patent
Jang et al.

(10) Patent Number: US RE39,273 E
(45) Date of Reissued Patent: Sep. 12, 2006

(54) HARD MASKING METHOD FOR FORMING PATTERNED OXYGEN CONTAINING PLASMA ETCHABLE LAYER

(75) Inventors: Syun-Ming Jang, Hsin-Chu (TW); Ming-Hsin Huang, Hsin-Chu (TW)

(73) Assignee: Taiwan Semiconductor Manufacturing Company, Ltd., Hsin-Chu (TW)

(21) Appl. No.: 10/062,314

(22) Filed: Feb. 1, 2002

Related U.S. Patent Documents

Reissue of:
(64) Patent No.: 6,019,906
Issued: Feb. 1, 2000
Appl. No.: 09/086,772
Filed: May 29, 1998

(51) Int. Cl.
*C23F 1/00* (2006.01)
*B44C 1/22* (2006.01)

(52) U.S. Cl. ..... 216/2; 216/67; 216/74; 216/75; 216/76; 216/80

(58) Field of Classification Search ..... 216/2, 216/67, 74, 75, 76, 80
See application file for complete search history.

(56) References Cited

U.S. PATENT DOCUMENTS 4,994,402 A * 2/1991 Chiu ..... 437/41
5,013,686 A * 5/1991 Choi et al. ..... 437/194
5,162,262 A * 11/1992 Ajika et al. ..... 437/200
5,219,788 A * 6/1993 Abernathey et al. ..... 437/187
5,246,883 A * 9/1993 Lin et al. ..... 437/195
5,256,248 A * 10/1993 Jun ..... 156/653
5,269,879 A * 12/1993 Rhoades et al. ..... 156/643
5,460,693 A * 10/1995 Moslehi ..... 156/662.1
5,472,913 A * 12/1995 Havemann et al. ..... 437/195
5,565,384 A * 10/1996 Havemann ..... 437/228
5,622,894 A * 4/1997 Jang et al. ..... 438/643
5,654,240 A * 8/1997 Lee et al. ..... 438/647
5,661,344 A * 8/1997 Havemann et al. ..... 257/758
5,700,737 A * 12/1997 Yu et al. ..... 438/636
5,721,172 A * 2/1998 Jang et al. ..... 438/424
5,840,624 A * 11/1998 Jang et al. ..... 438/624
5,858,623 A * 1/1999 Yu et al. ..... 430/315

* cited by examiner

*Primary Examiner*—Cam N. Nguyen
(74) *Attorney, Agent, or Firm*—Haynes and Boone, LLP

(57) ABSTRACT

A method for forming a patterned microelectronics layer within a microelectronics fabrication. There is first provided a substrate employed within a microelectronics fabrication. There is then formed over the substrate an oxygen containing plasma etchable microelectronics layer. There is then formed upon the oxygen containing plasma etchable microelectronics layer a hard mask layer. There is then formed upon the hard mask layer a patterned photoresist layer. There is then etched through use of a first anisotropic plasma etch method the hard mask layer to form a patterned hard mask layer while employing the patterned photoresists layer as a first etch mask layer. The first anisotropic plasma etch method employs an etchant gas composition appropriate for etching a hard mask material from which is formed the hard mask layer. There is then etched through use of a second plasma etch method the patterned photoresist layer from the patterned hard mask layer while employing the patterned hard mask layer as an etch stop layer while simultaneously etching the oxygen containing plasma etchable microelectronics layer while employing at least the patterned hard mask layer as a second etch mask layer to form a patterned oxygen containing plasma etchable microelectronics layer. The second plasma etch method employs an oxygen containing etchant gas composition. The method is particularly useful for forming patterned oxygen containing plasma etchable microelectronics dielectric layers within microelectronics fabrications.

28 Claims, 2 Drawing Sheets

HARD MASKING METHOD FOR FORMING PATTERNED OXYGEN CONTAINING PLASMA ETCHABLE LAYER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to oxygen containing plasma etchable layers within microelectronics fabrications. More particularly, the present invention relates to methods for forming patterned oxygen containing plasma etchiable layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor element dimensions have decreased, it has been increasingly common within the art of microelectronics fabrication to employ interposed between the patterns of narrow linewidth dimension and/or narrow pitch dimensions patterned microelectronics conductor layers within microelectronics fabrications microelectronics dielectric layers formed of low dielectric constant dielectric materials. For the purposes of this disclosure, low dielectric constant dielectric materials are intended as dielectric materials having a dielectric constant of less than about 3.6. Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers through which there may be fabricated microelectronics fabrications with enhanced microelectronics fabrication speed, attenuated patterned microelectronics conductor layer parasitic capacitance and attenuated patterned microelectronics conductor layer cross-talk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, poly (arylene ether) organic polymer spin-on-polymer dielectric materials and fluorinated poly (arylene ether) organic polymer spin-on-polymer dielectric materials), amorphous carbon dielectric materials and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials). Silsesquioxane spin-on-glass (SOG) dielectric materials are characterized by the general chemical formula R1—Si(OR2)3, where: (1) R1 may be any of several radicals, including but not limited to hydrogen radical (—H) and carbon bonded organic radicals such as but not limited to carbon bonded hydrocarbon radicals (such as but not limited to methyl radical (—CH3) and ethyl radical (—C2H5)) and carbon bonded fluorocarbon radicals (such as but not limited to trifluoromethyl radical (—CF3) and pentafluoroethyl radical (—C2F5)), but not oxygen bonded radicals; and (2) R2 is typically, although not exclusively, a carbon bonded organic radical such as but not limited to methyl radical (—CH3) or an ethyl radical (—C2H5). Organic polymer spin-on-polymer dielectric materials and silsesquioxane spin-on-glass dielectric materials are typically spin-coated and subsequently thermally cured at temperatures of from about 350 to about 420 degrees centigrade to form within microelectronics fabrications low dielectric constant microelectronics dielectric layers. In contrast, amorphous carbon dielectric materials are typically formed into low dielectric constant dielectric layers within microelectronics fabrications through use of thin film deposition methods such as but not limited to chemical vapor deposition (CVD) methods and physical vapor deposition (PVD) methods.

While organic polymer spin-on-polymer dielectric materials, amorphous carbon dielectric materials and silsesquioxanie spin-on-glass (SOG) dielectric materials are thus desirable within the art of microelectronics fabrication for forming low dielectric constant microelectronics dielectric layers within microelectronics fabrications, organic polymer spin-on-polymer dielectric materials, amorphous carbon dielectric materials and silsesquioxane spin-on-glass (SOG) dielectric materials are not entirely without problems in forming low dielectric constant microelectronics dielectric layers within microelectronics fabrications. In particular, low dielectric constant dielectric layers formed employing organic polymer spin-on polymer dielectric materials, amorphous carbon dielectric materials and silsesquioxane spin-on-glass (SOG) dielectric materials are, due to their hydrogen content and/or carbon content, difficult to pattern with uniform linewidth dimension within advanced microelectronics fabrications through use of conventional photolithographic methods employing conventional positive or negative photoresist etch mask layers, since when stripping through a conventional oxygen containing plasma etch method from such a patterned low dielectric constant microelectronics dielectric layer a conventional positive or negative photoresist etch mask layer which is employed in defining the patterned low dielectric constant microelectronics dielectric layer, there is typically laterally etched the patterned low dielectric constant microelectronics dielectric layer due to susceptibility to etching of the low dielectric constant dielectric material within the oxygen containing plasma etch method.

Laterally etched patterned low dielectric constant microelectronics dielectric layers are undesirable within advanced microelectronics fabrications since when such laterally etched patterned low dielectric constant microelectronics dielectric layers have contact vias or interconnection vias formed therethrough to access semiconductor substrate contact regions or patterned conductor layer contact regions within microelectronics fabrications there is often compromised the linewidth and/or spacing of patterned microelectronics conductor stud layers formed within the contact vias or interconnection vias formed through those laterally etched patterned low dielectric constant microelectronics dielectric layers.

It is thus towards the goal of forming within advanced microelectronics fabrications patterned low dielectric constant microelectronics dielectric layers formed from oxygen containing plasma etchable dielectric materials, with attenuated lateral etching of the patterned low dielectric constant microelectronics dielectric layers when stripping from the patterned low dielectric constant microelectronics dielectric layers through use of oxygen containing plasma etch methods patterned photoresist layers employed in defining those patterned low dielectric constant microelectronics dielectric layers that the present invention is more specifically directed. In a more general sense, the present invention is also directed towards forming within advanced microelectronics fabrications patterned microelectronics layers (not necessarily patterned microelectronics dielectric layers) formed of oxygen containing plasma etchable materials with attenuated lateral etching of the patterned microelectronics layers when stripping from the patterned microelectronics layers through use of oxygen containing plasma etch methods patterned photoresist layers which are employed in defining those patterned microelectronics layers.

Various photolithographic and etch methods have been disclosed in the art of microelectronics fabrication for forming patterned microelectronics layers within microelectronics fabrications.

For example, Lin et al., in U.S. Pat. No. 5,246,883, discloses a method for forming a contact via structure through at least one dielectric layer within an integrated circuit microelectronics fabrication. The method employs at least the one dielectric layer having formed thereover a first buffer layer which in turn has formed thereupon a second buffer layer, where the second buffer layer has a higher isotropic etch rate in an isotropic etch method than the first buffer layer. By employing the isotropic each method for etching the second buffer layer and at least a portion of the first buffer layer, followed by an anisotropic etch method for etching any remainder of the first buffer layer and at least the one dielectric layer, the taper of the sidewall of a via formed through at least the second buffer layer, the first buffer layer and the dielectric layer may be controlled.

In addition, Moslehi, in U.S. Pat. No. 5,460,693, discloses a photolithography method for use in fabricating patterned integrated circuit microelectronics layers within integrated circuit microelectronics fabrications, where the photolithography method is undertaken employing dry processing methods only. The completely day processing photolithography method employs a halogen doped silicon layer or a halogen doped silicon-germanium layer as a photosensitive layer from which is subsequently grown an oxide hard mask layer employed as an etch mask layer when etching a processible integrated circuit microelectronics layer formed below the halogen doped silicon layer or the halogen doped silicon-germanium layer.

Further, Havemann, in U.S. Pat. No. 5,565,384, the teachings of which are incorporated herein fully by reference, discloses a method for forming within an integrated circuit microelectronics fabrication a self-aligned via through an inorganic dielectric layer to access a patterned conductor layer formed below the inorganic dielectric layer, where the patterned conductor layer has interposed at least partially between its patterns an organic containing dielectric layer. The patterned conductor layer and the organic containing dielectric layer are completely covered by the inorganic dielectric layer. The method employs an anisotropic etchant which is selective to be inorganic dielectric layer with respect to the organic dielectric layer, such that the organic dielectric layer serves as an etch stop layer when etching the self-aligned via through the inorganic dielectric layer, thus avoiding overetching of the organic dielectric layer.

Finally, Lee et al., in U.S. Pat. No. 5,654,240, discloses a method for forming a patterned conductor contact layer contacting a semiconductor substrate within an integrated circuit microelectronics fabrication, while avoiding trenching within the semiconductor substrate when etching the patterned conductor contact layer from a corresponding blanket conductor contact layer formed contacting the semiconductor substrate. The method employs: (1) a first patterned conductor layer formed upon a patterned dielectric layer formed upon the semiconductor substrate, where the first patterned conductor layer does not contact the semiconductor substrate; and (2) a second patterned conductor layer patterned to terminate upon the first patterned conductor layer while contacting the first patterned conductor layer and the semiconductor substrate.

Desirable within the art of microelectronics fabrication are methods and materials through which there may be formed within microelectronics fabrications patterned microelectronics layers formed of oxygen containing plasma etch able materials, with attenuated lateral etching of the patterned microelectronics layers when stripping from the patterned microelectronics layers through use of oxygen containing plasma etching methods patterned photoresist layers employed in defining those patterned microelectronics layers. More particularly desirable within the art of microelectronics fabrication are methods and materials through which there may be formed within microelectronics fabrications patterned low dielectric constant microelectronics dielectric layers formed of oxygen containing plasma etchable low dielectric constant dielectric materials, with attenuated lateral etching of the patterned low dielectric constant microelectronics dielectric layers when stripping from the patterned low dielectric constant microelectronics dielectric layers through use of oxygen containing plasma etch methods patterned photoresist layers employed in defining those patterned low dielectric constant microelectronics dielectric layers.

It is towards the foregoing objects that the present invention is both generally and more specifically directed.

SUMMARY OF THE INVENTION

A first object of the present invention is to provide a method for forming within a microelectronics fabrication a patterned microelectronics layer formed from an oxygen containing plasma etchable material.

A second object of the present invention is to provide a method in accord with the first object of the present invention, where the patterned microelectronics layer is formed with attenuated lateral etching of the patterned microelectronics layer when stripping from the patterned microelectronics layer through use of an oxygen containing plasma etch method a patterned photoresist layer employed in defining the patterned microelectronics layer.

A third object of the present invention is to provide a method in accord with the first object of the present invention and the second object of the present invention, where the oxygen containing plasma etchable material is a low dielectric constant dielectric material.

A fourth object of the present invention is to provide a method in accord with the first object of the present invention, the second object of the present invention and the third object of the present invention, which method is readily commercially implemented.

In accord with the objects of the present invention, there is provided by the present invention a method for forming a patterned microelectronics layer within a microelectronics fabrication. To practice the method of the present invention, there is first provided a substrate employed within a microelectronics fabrication. There is then formed over the substrate an oxygen containing plasma etchiable microelectronics layer. There is then formed upon the oxygen containing plasma etchable microelectronics layer a hard mask layer. There is then formed upon the hard mask layer a patterned photoresist layer. There is then etched through use of a first anisotropic plasma etch method the hard mask layer to for a patterned hard mask layer while employing the patterned photoresist layer as a first etch mask layer. The first anisotropic plasma etch method employs an etchant gas composition appropriate for etching a hard mask material from which is formed the hard mask layer. There is then etched through use of a second plasma etch method the patterned photoresist layer from the patterned hard mask layer while employing the patterned hard mask layer as an etch stop layer while simultaneously etching the oxygen containing plasma etchable layer while employing at least the patterned hard mask layer as a second etch mask layer to form a patterned oxygen containing plasma etchable microelectronics layer. The second plasma etch method is an oxygen containing plasma etch method employing an oxygen containing etchant gas composition.

There is provided by the present invention a method for forming within a microelectronics fabrication a patterned microelectronics layer from an oxygen containing plasma etchable material, where the patterned microelectronics layer is formed with attenuated lateral etching of the patterned microelectronics layer when stripping from the patterned microelectronics layer through use of an oxygen containing plasma etch method a patterned photoresist layer employed in defining the patterned microelectronics layer. The method of the present invention realizes in part the foregoing objects by forming through use of a first anisotropic plasma etch method a patterned hard mask layer interposed between the patterned photoresist layer and a microelectronics layer from which is formed the patterned microelectronics layer. There is then employed a second plasma etch method through which there is simultaneously: (1) stripped from the patterned hard mask layer the patterned photoresist layer; and (2) patterned the microelectronics layer to form the patterned microelectronics layer.

The method of the present invention may be employed where the oxygen containing plasma etchable material is a low dielectric constant dielectric material. The method of the present invention does not discriminate with respect to the nature of oxygen containing plasma etchable material provided that the oxygen containing plasma etchable material is in fact oxygen containing plasma etchiable. Thus, the method of the present invention may be employed where the oxygen containing plasma etchable material is a low dielectric constant dielectric material, as well as other oxygen containing plasma etchable material such as but not limited to oxygen containing plasma etchable conductor materials, oxygen containing plasma etchable semiconductor materials and oxygen containing plasma etchable higher dielectric constant dielectric materials.

The method of the present invention is readily commercially implemented. The method of the present invention employs methods and materials as are otherwise generally known in the art of microelectronics fabrication. Since it is the process control and process sequencing within the method of the present invention which provides, at least in part, novelty to the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within a microelectronics fabrication a patterned microelectronics layer from an oxygen containing plasma etchable material, where the patterned microelectronics layer is formed with attenuated lateral etching of the patterned microelectronics layer when stripping from the patterned microelectronics layer through use of an oxygen containing plasma etch method a patterned photoresist layer employed in defining the patterned microelectronics layer. The method of the present invention realizes the foregoing objects by employing interposed between a blanket microelectronics layer from which is formed the patterned microelectronics layer and the patterned photoresists layer which is employed in defining the patterned microelectronics layer a patterned hard mask layer. There is then simultaneously etched while employing the oxygen containing plasma etch method: (1) the patterned photoresist layer from the patterned hard mask layer; and (2) the blanket microelectronics layer to form the patterned microelectronics layer.

Although the method of the present invention is most likely to provide value when forming within a microelectronics fabrication a via through a low dielectric constant microelectronics dielectric layer formed of an oxygen containing plasma etchable low dielectric constant dielectric material, the method of the present invention may be employed in forming patterned microelectronics layers formed of oxygen containing plasma etchable microelectronics materials including but not limited to oxygen containing plasma etchable microelectronics conductor materials, oxygen containing plasma etchable microelectronics semiconductor materials and oxygen containing plasma etchable microelectronics dielectric materials. Microelectronics fabrications within which may be formed patterned microelectronics layers of oxygen containing plasma etchable materials through the method of the present invention include but are not limited to integrated circuit microelectronics fabrications, solar cell microelectronics fabrications, ceramic substrate microelectronics fabrications and flat panel display microelectronics fabrications.

First Preferred Embodiment

Figure 1:
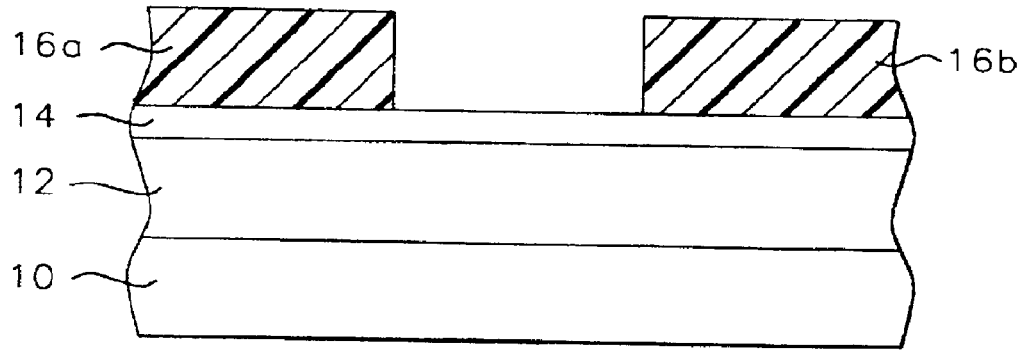
FIG. 1 to FIG. 3 show a series of schematic cross-sectional diagrams illustrating the results of forming within a microelectronics fabrication in accord with a general embodiment of the present invention which comprises a first preferred embodiment of the present invention a patterned oxygen containing plasma etchable microelectronics layer from a blanket oxygen containing plasma etchable microelectronics layer.
Figure 2:
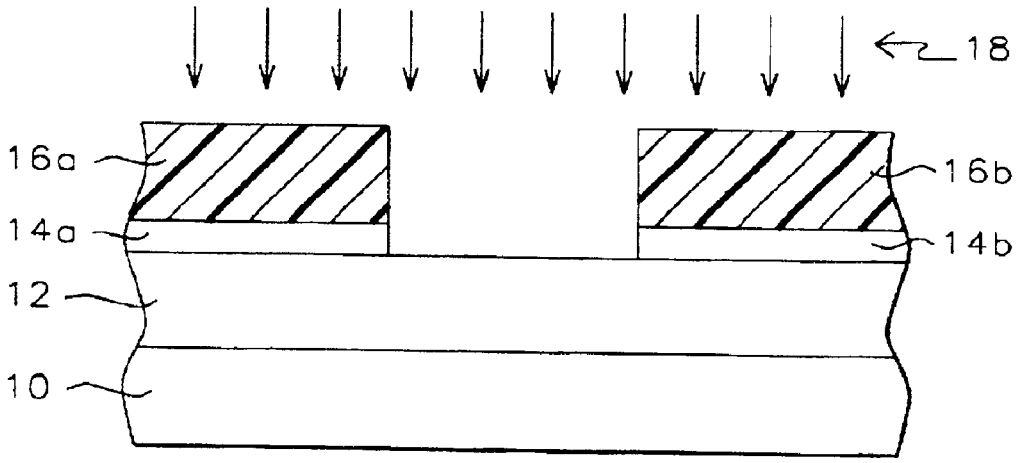
Figure 3:
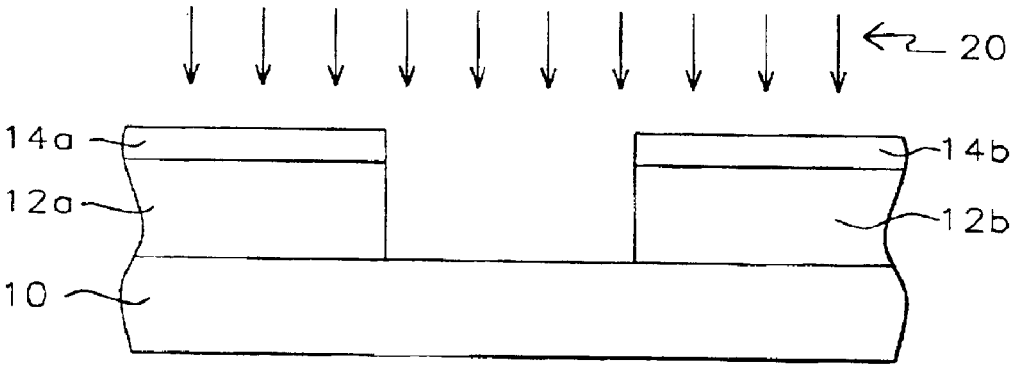

Referring now to FIG. 1 to FIG. 3, there is shown a series of schematic cross-sectional diagrams illustrating the results of forming within a microelectronics fabrication in accord with a general preferred embodiment of the present invention which comprises a first preferred embodiment of the present invention a patterned microelectronics layer formed of an oxygen containing plasma etchable material. Shown in FIG. 1 is a schematic cross-sectional diagram of the microelectronics fabrication at an early stage in its fabrication in accord with the method of the present invention.

Shown in FIG. 1 is a substrate 10 employed within a microelectronics fabrication, where the substrate 10 has formed thereover a blanket oxygen containing plasma etchable layer 12. In turn, the blanket oxygen containing plasma etchable layer 12 has formed thereupon a blanket hard mask layer 14. Finally, the blanket hard mask layer 14 has formed thereupon a pair of patterned photoresist layers 16a and 16b.

Within the first preferred embodiment of the present invention, the substrate 10 may be employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications. Similarly, although not specifically illustrated within the schematic cross-sectional diagram of FIG. 1, the substrate 10 may be the substrate alone employed within the microelectronics fabrication, or in the alternative, the substrate 10 may be the substrate employed within the microelectronics fabrication, where the substrate 10 is intended to include the substrate alone employed within the microelectronics fabrication, along with additional microelectronics layers formed interposed between the substrate 10 and the blanket oxygen containing plasma etchable layer 12. Such additional microelectronics layers may include, but are not limited to, microelectronics conductor layers, microelectronics semiconductor layers and microelectronics dielectric layers as conventionally employed within a microelectronics fabrication within which is employed the substrate 10. Similarly, although also not specifically illustrated within the schematic cross-sectional diagram of FIG. 1, the substrate 10, particularly when the substrate is a semiconductor substrate employed within an integrated circuit microelectronics fabrication, will typically and preferably have microelectronics devices, such as but not limited to resistors, transistors and diodes formed therein, thereupon and/or thereover.

Within the first preferred embodiment of the present invention with respect to the blanket oxygen containing plasma etchable layer 12, the blanket oxygen containing plasma etchable layer 12 may be formed from any oxygen containing plasma etchable material as it is conventional in the art of microelectronics fabrication, provided that the blanket oxygen containing plasma etchable layer 12 may be completely etched to form a patterned oxygen containing plasma etchable layer within the oxygen containing plasma. Such oxygen containing plasma etchable materials may include, but are not limited to, oxygen containing plasma etchable conductor materials, oxygen containing plasma etchable semiconductor (or semidielectric) materials and oxygen containing plasma etchable dielectric materials. Oxygen containing plasma etchable conductor materials may include, but are not limited to, graphite materials, while oxygen containing plasma etchable semiconductor (or semidielectric) materials may include, but are not limited to, oxygen containing plasma etchable dielectric materials having incorporated therein graphite materials. Preferably, the blanket oxygen containing plasma etchable layer 12 is formed to a thickness of from about 6000 to about 13000 angstroms over the substrate 10.

Within the first preferred embodiment of the present invention with respect to the blanket hard mask layer 14, the blanket hard mask layer 14 is may be formed of any hard mask material which is not susceptible to etching within an oxygen containing plasma etch method. Such hard mask materials may include, but are not limited to metals, metal alloys, metal oxides, metal nitrides, non-metal oxides, non-metal nitrides and composites thereof. Typically and preferably, the blanket hard mask layer 14 is formed from a hard mask material selected from the group of hard mask materials including but not limited to silicon oxide hard mask materials, silicon nitride hard mask materials and silicon nitride hard mask materials. Preferably, the blanket hard mask layer 14 is formed to a thickness of from about 500 to about 2000 angstroms upon the blanket oxygen containing plasma etchable layer 12.

Finally, within the first preferred embodiment of the present invention with respect to the patterned photoresist layers 16a and 16b, the patterned photoresist layer 16a and 16b may be formed from any of several photoresist materials as are conventional in the art of microelectronics fabrication, such photoresist materials being selected from the general groups of photoresist materials including but not limited to positive photoresist materials and negative photoresist materials. Preferably, the patterned photoresist layers 16a and 16b so formed are each formed to a thickness of from about 7000 to about 15000 angstroms.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 14 has been patterned to form the patterned hard mask layers 14a and 14b through etching with a first etching plasma 18 while employing the patterned photoresist layers 16a and 16b as a first etch mask layer. Within the first preferred embodiment of the present invention, the first etching plasma 18 is an anisotropic etching plasma which employs an etchant gas composition appropriate to the material formed which is formed the blanket hard mask layer 14. Within the first preferred embodiment of the present invention, where the blanket hard mask layer 14 is formed from a silicon containing dielectric material, such as but not limited to silicon oxide dielectric material, a silicon nitride dielectric material or a silicon oxynitride dielectric material, the first etching plasma 18 preferably employs an etchant gas composition comprising an etchant gas which upon plasma activation provides an active fluorine containing etchant species. Such etchant gas compositions typically comprise, but are not limited to, fluorocarbon etchant gases.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein: (1) there is stripped from the patterned hard mask layers 14a and 14b the corresponding patterned photoresist layers 16a and 16b; and (2) there is formed from the blanket oxygen containing plasma etchable layer 12 the patterned oxygen containing plasma etchable layers 12a and 12b, through etching within a second etching plasma 20. The second etching plasma 20 is an oxygen containing etching plasma employing an oxygen containing etchant gas composition which upon plasma activation forms an active oxygen containing species which etches the blanket oxygen containing plasma etchable layer 12.

Within the first preferred embodiment of the present inventions the oxygen containing etchant gas composition may employ an oxygen containing etchant gas selected from the group of oxygen containing etchant gases including but not limited to oxygen, ozone, nitrous oxide and nitric oxide. Similarly, within the first preferred embodiment of the present invention the second etching plasma 20 is typically and preferably employed at a reactor chamber pressure substantially lower that a reactor chamber pressure typically employed when stripping patterned photoresist layers from microelectronics fabrications. While conventional dry oxygen plasma patterned photoresist layer stripping methods typically employ reactor chamber pressures of from about 0.1 to about 2 torr, within the first preferred embodiment of the present invention, the oxygen containing plasma etch method within which is employed the second etching plasma 20 preferably employs a reactor chamber pressure of from about 1 to 20 mtorr, more preferably from about 3 to about 15 mtorr and most preferably from about 5 to about 10 mtorr. Under such circumstances, there is attenuated a lateral etching of the blanket oxygen containing plasma etchable layer 12 when forming the patterned oxygen containing plasma etchable layers 12a and 12b.

In addition, within the first preferred embodiment of the present invention it is also desirable to employ within the oxygen containing plasma etch method which employs the second etching plasma 20 a sputtering gas component within the oxygen containing etchant gas composition. Similarly with the reduction of reactor chamber pressure, the presence of a sputtering gas component also attenuates lateral etching of the patterned oxygen containing plasma etchable layers 12a and 12b when forming the patterned oxygen containing plasma etchable layers 12a and 12b. Typical sputtering gas components include, but are not limited to argon and xenon, with argon being particularly preferred. Typically and preferably, the sputtering gas component is present at a volume percentage of from about 10 to about 40 percent of the etchant gas composition employed within the second etching plasma 20.

Finally, within the first preferred embodiment of the present invention the thicknesses of the patterned photoresist layers 16a and 16b and the blanket oxygen containing plasma etchable layer 12 are selected such that within the oxygen containing plasma etch method employing the second etching plasma 20 there is completely stripped the patterned photoresist layers 16a and 16b from the patterned hard mask layers 14a and 14b, and completely etched the blanket oxygen containing plasma etchable layer 12 when forming the oxygen containing plasma etchable layers 12a and 12b with an attenuated and minimal. If any lateral etching of the patterned oxygen containing plasma etchable layers 12a and 12b. This typically requires that the patterned photoresist layers 16a and 16b are completely etched from the patterned hard mask layers 14a and 14b before the blanket oxygen containing plasma etchable layer 12 is completely patterned to form the patterned oxygen containing plasma etchable layers 12a and 12b.

Upon forming the microelectronics fabrication whose schematic cross-sectional diagram is illustrated in FIG. 3, there is formed a microelectronics fabrication having formed therein a pair of patterned oxygen containing plasma etchable layers within attenuated internal etching of the pair of patterned oxygen containing plasma etchable layers when etching from the microelectronics fabrication a pair of patterned photoresist layers employed in defining the pair of patterned oxygen containing plasma etchable layers.

Second Preferred Embodiment

Figure 4:
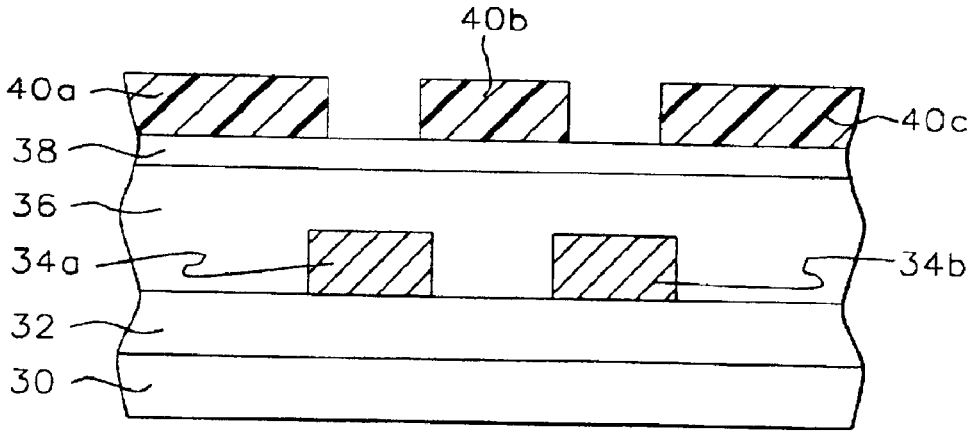
FIG. 4 to FIG. 6 show a series of schematic cross-sectional diagrams illustrating the results of forming within a microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer within the microelectronics fabrication.
Figure 5:
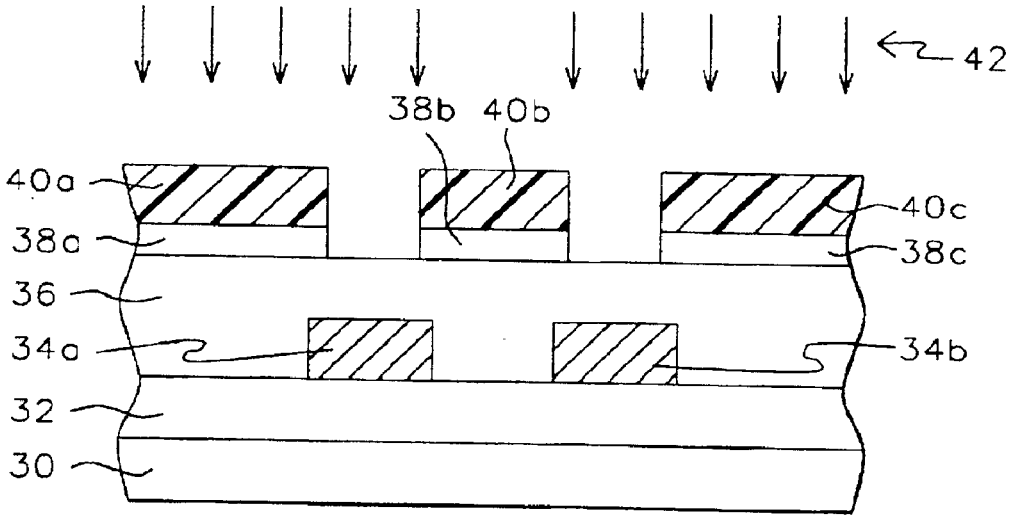
Figure 6:
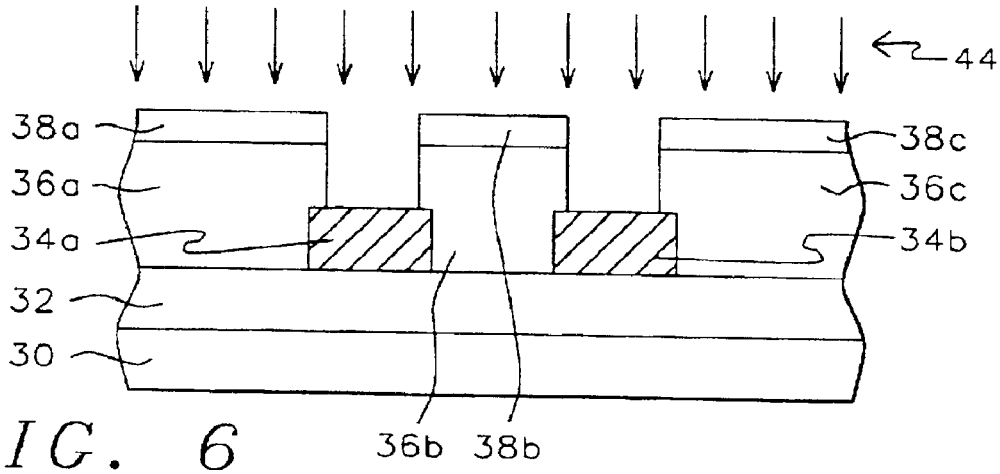

Referring now to FIG. 4 to FIG. 6, there is shown a series of schematic cross-sectional diagrams illustrating the results of forming within a microelectronics fabrication in accord with a more specific embodiment of the present invention which comprises a second preferred embodiment of the present invention a pair of vias through a low dielectric constant microelectronics dielectric layer formed of an oxygen containing plasma etchable dielectric material to access a pair of patterned conductor layers formed beneath the low dielectric constant microelectronics dielectric layer within the microelectronics fabrication. Shown in FIG. 4 is a schematic cross-sectional diagram of the microelectronics fabrication at an early stage in practice of the method of the present invention.

Shown in FIG. 4 is a substrate 30 employed within a microelectronics fabrication, where the substrate 30 has formed thereover a blanket first dielectric layer 32. In turn, the blanket first dielectric layer 32 has formed thereupon a pair of patterned conductor layers 34a and 34b. The patterned conductor layers 34a and 34b, and portions of the blanket first dielectric layer 36 exposed adjoining the patterned conductor layers 34a and 34b, have formed thereupon a blanket inter-metal dielectric (IMD) layer 36. The blanket inter-metal dielectric (IMD) layer 36 has formed thereupon a blanket hard mask layer 38. Finally, the blanket hard mask layer 38 has formed thereupon a series of patterned photoresist layers 40a, 40b and 40c.

Within the second preferred embodiment of the present invention, the substrate 30, analogously or equivalent with the substrate 10 employed within the first preferred embodiment of the present invention as illustrated within FIG. 1 may be a substrate employed within a microelectronics fabrication selected from the group of microelectronics fabrications including but not limited to integrated circuit microelectronics fabrications solar cell microelectronics fabrications, ceramic substrate microelectronics fabrications and flat panel display microelectronics fabrications.

Within the second preferred embodiment of the present invention with respect to the blanket first dielectric layer 32, the blanket first dielectric layer 32 may be formed from any of several dielectric materials as are conventional in the art of microelectronics fabrication. Such dielectric materials may include but are not limited to silicon oxide dielectric materials, silicon nitride dielectric materials, silicon oxynitride dielectric materials and composites thereof, as well as any of the several oxygen containing plasma etchable low dielectric constant dielectric materials as discussed within the Description of the Related Art. Preferably, the blanket first dielectric layer 32 as illustrated within the schematic cross-sectional diagram of FIG. 4 is formed from a silicon oxide dielectric material deposited through use of a plasma enhanced chemical vapor deposition (PECVD) method, as is conventional in the art of microelectronics fabrication. Preferably, the blanket first dielectric layer 32 so formed is formed to a thickness of from about 6000 to about 13000 angstroms over the substrate 30.

Within the second preferred embodiment of the present invention with respect to the patterned conductor layers 34a and 34b, methods and materials through which patterned conductor layers may be formed within microelectronics fabrications are known in the art of microelectronics fabrication. Patterned conductor layers may be formed within microelectronics fabrications through patterning, through use of methods as are conventional in the art of microelectronics fabrication, of blanket conductor layers formed within microelectronics fabrications. Blanket conductor layers may be formed within microelectronics fabrications through use of methods including but not limited to thermally assisted evaporations methods, electron beam assisted evaporations methods, chemical vapor deposition (CVD) methods and physical vapor deposition (PVD) sputtering methods through which may be formed blanket conductor layers of conductor materials including but not limited to metals, metal alloys, doped polysilicon and polycides (doped polysilicon/metal silicide stacks). For the second preferred embodiment of the present invention, the patterned conductor layers 34a and 34b are preferably formed at least in part of an aluminum containing conductor material, beneath and/or above which is formed an optional barrier material, as is common in the art of microelectronics fabrication. Preferably the patterned conductor layers 34a and 34b so formed are each formed to a thickness of from about 4000 to about 7000 angstroms upon the blanket first dielecric layer 32.

Although not specifically illustrated within the schematic cross-sectional diagram of FIG. 4, the patterned conductor layers 34a and 34b are each formed of a linewidth preferably from about 0.25 to about 1.0 microns and each separated by a pitch distance preferably from about 0.25 to about 1.0 microns.

Within the second preferred embodiment of the present invention with respect to the blanket inter-metal dielectric (IMD) layer 36, while the blanket inter-metal dielectric (IMD) layer 36 corresponds generally with the blanket oxygen containing plasma etchable layer 12 within the first preferred embodiment of the present invention insofar as the blanket inter-metal dielectric (IMD) layer 36 is also formed of an oxygen containing plasma etchable material within the second preferred embodiment of the present invention, the blanket inter-metal dielectric (IMD) layer 36 is formed from an oxygen containing plasma etchable material which is a low dielectric constant dielectric material. As is disclosed above within the Description of the Related Art, such oxygen containing plasma etchable low dielectric constant dielectric materials may include, but are not limited to organic polymer spin-on-polymer dielectric materials (such as but not limited to polyimide organic polymer spin-on-polymer dielectric materials, poly (arylene ether) organic polymer spin-on-polymer dielectric materials and fluorinated poly (arylene ether) organic polymer spin-on-polymer dielectric materials) and amorphous carbon dielectric materials. In contrast with the disclosure within the Description of the Related Art, silsesquioxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials) are not preferred within the method of the present invention since they are not typically completely etchable within an oxygen containing plasma, but will rather typically form a silicon oxide type residue.

Within the second preferred embodiment of the present invention, the blanket inter-metal dielectric (IMD) layer 36 is preferably formed to a thickness of from 6000 to about 13000 angstroms through spin-coating and curing of a poly (arylene ether) spin-on-polymer dielectric material or a fluorinated poly (arylene ether) spin-on-polymer dielectric material at a temperature of from about 350 to about 420 degrees centigrade. Such poly (arylene ether) spin-on-polymer dielectric materials and fluorinated poly (arylene ether) spin-on-polymer dielectric materials are known in the art and are commercially available, for example, from Schumacher, Inc. as product number PAE-2.0 and PAE-2.3 spin-on-polymer dielectric materials and from Allied-Signal Corporation as product number FLARE™ 2.0 spin-on-polymer dielectric materials.

Within the second preferred embodiment of the present invention with respect to the blanket hard mask layer 38, although the blanket hard mask layer 38 may generally be formed employing methods and materials analogous or equivalent to the methods and materials employed in forming the blanket hard mask layer 14 employed within the first preferred embodiment of the present invention as illustrated in FIG. 1, within the second preferred embodiment of the present invention, the blanket hard mask layer 38 is preferably formed of a silicon oxide dielectric material deposited through use of plasma enhanced chemical vapor deposition (PECVD) method employing silane as a silicon source material. Preferably, the blanket hard mask layer 38 so formed is formed to a thickness of from about 500 to about 2000 angstroms upon the blanket inter-metal dielectric (IMD) layer 36.

Finally, within the second preferred embodiment of the present invention with respect to the series of patterned photoresist layers 40a, 40b and 40c, the series of patterned photoresist layers 40a, 40b, and 40c is preferably formed employing methods, materials, and dimensions analogous or equivalent to the methods, materials and dimensions employed in forming the patterned photoresist layers 16a and 16b within the first preferred embodiment of the present invention as illustrated within the schematic cross-sectional diagram of FIG. 1.

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket hard mask layer 38 has been patterned to form the patterned hard mask layer 38a, 38b and 38c through etching with a first etching plasma 42 while employing the patterned photoresist layers 40a, 40b and 40c as a series of photoresist etch mask layers.

Within the second preferred embodiment of the present invention, where the blanket hard mask layer 38 is preferably formed of a silicon oxide hard mask material, the first etching plasma 42 is employed within a first plasma etch method which preferably employs an etchant gas composition which upon plasma activation provide an active fluorine etching species. More preferably, the first plasma etch method employs a carbon tetrafluoride, hexafluoroethane and argon etchant gas composition. Preferably, the first plasma etch method also employs: (1) a reactor chamber pressure of from about 2 to about 8 mtorr: (2) a radio frequency source power of from about 1000 to about 2000 watts at a radio frequency of 13.56 MHZ; (3) a radio frequency bias power of from about 1000 to about 2000 watts; (4) a carbon tetrafluoride flow rate of from about 10 to about 20 standard cubic centimeters per minute (sccm); (5) a hexafluoroethane flow rate of from about 10 to about 20 standard cubic centimeters per minute (sccm); and (6) an argon flow rate of from about 100 to about 300 standard cubic centimeters per minute (sccm), for a time period sufficient to completely etch through the blanket hard mask layer 38 when forming the patterned hard mask layers 38a, 38b and 38c.

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein there has been simultaneously: (1) stripped from the patterned hard mask layers 38a, 38b and 38c the corresponding patterned photoresist layers 40a, 40b and 40c; and (2) patterned the blanket inter-metal dielectric (IMD) layer 36 to form the patterned inter-metal dielectric (IMD) layers 36a, 36b and 36c, through etching with a second etching plasma 44. Within the second preferred embodiment of the present invention, the second etching plasma 44 is preferably employs methods and materials analogous or equivalent to the method and materials employed in forming the second etching plasma 20 within the first preferred embodiment of the present invention as illustrated within the schematic cross-sectional diagram of FIG. 3.

More preferably, the second etching plasma 44 is employed within a oxygen containing plasma etch method which employs an oxygen and argon containing etchant gas composition. Preferably, the oxygen containing plasma etch method also employs: (1) a reactor chamber pressure of from about 2 to about 10 mtorr; (2) a source radio frequency power of from about 500 to about 1500 watts at a source radio frequency of 13.56 MHZ; (3) a bias radio frequency power of from about 1000 to about 2000 watts; (4) an oxygen flow rate of from about 10 to about 50 standard cubic centimeters per minute (sccm); and (5) an argon flow rate of from about 5 to about 20 standard cubic centimeters per minute (sccm), for a time period sufficient to reach the patterned conductor layers 34a and 34b, while simultaneously forming the patterned inter-metal dielectric (IMD) layers 36a, 36b and 36c. Optionally, there may also be employed within the second etching plasma 44 a helium background gas at a flow of from about 1 to 5 standard cubic centimeters per minute (sccm) and/or a hexafluoroethane etchant gas at a flow of from about 1 to about 5 standard cubic centimeters per minute (sccm).

When employing within the second preferred embodiment of the present invention the preferred materials as disclosed above for the patterned photoresist layers 40a, 40b and 40c, the blanket hard mask layer 38 and the blanket inter-metal dielectric (IMD) layer 36, along with the methods and materials as disclosed within the first etching plasma 42 and the second etching plasma 44, there is formed the microelectronics fabrication as illustrated within FIG. 6. The microelectronics fabrication has formed therein a pair of interconnection vias through an inter-metal dielectric layer accessing a pair of patterned conductor layers, where the pair of interconnection via is formed with attenuated lateral etching of the pair of interconnection vias when stripping from a series of patterned hard mask layers a series of patterned photoresist layers employed in defining the pair of vias through the inter-metal dielectric (IMD) layer.

As is understood by a person skilled in the art, various of the embodiments of microelectronics fabrications as disclosed by Havemann, in U.S. Pat. No. 5,565,384, the teachings of which are incorporated herein fully by reference, may also be modified in accord with the method of present invention as disclosed herein.

As is similarity understood by a person skilled in the art, the preferred embodiments of the present invention are illustrative of the present invention rather than limiting of the present invention. Revisions and modifications may be made to methods, materials, structures and dimensions through which are fabricated microelectronics fabrications in accord with the preferred embodiments of the present invention while still providing embodiments which are within the spirit and scope of the present invention, as defined by the appended claims.

What is claimed is:

1. A method for forming a patterned microelectronics layer within a microelectronics fabrication comprising:

providing a substrate employed within a microelectronics fabrication;

forming over the substrate an oxygen containing plasma etchable microelectronics layer;

forming upon the oxygen containing plasma etchable microelectronics layer a hard mask layer;

forming upon the hard mask layer a patterned photoresist layer;

etching through use of a first anisotropic plasma etch method the hard mask layer to form a patterned hard mask layer while employing the patterned photoresist layer as a first etch mask layer, the first anisotropic plasma etch method employing an etchant gas composition appropriate for etching a hard mask material from which is formed the hard mask layer;

etching through use of a second plasma etch method the patterned photoresist layer from the patterned hard mask layer while employing the patterned hard mask layer as an etch stop layer while simultaneously etching the oxygen containing plasma etchable microelectronics layer while employing at least the patterned hard mask layer as a second etch mask layer to form a patterned oxygen containing plasma etchable microelectronics layer, the second plasma etch method employing an oxygen containing etchant gas composition.

2. The method of claim 1 wherein a thickness of the patterned photoresist layer and a thickness of the oxygen containing plasma etchable microelectronics layer are each selected to provide that:

the patterned photoresists layer is completely etched from the patterned hard mask layer;

the oxygen containing plasma etchable microelectronics layer is completely etched to form the patterned oxygen containing plasma etchable microelectronics layer; and there is attenuated lateral etching of the patterned oxygen containing plasma etchable microelectronics layer.

3. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

4. The method of claim 1 wherein the oxygen containing plasma etchable microelectronics layer is formed from an [an oxygen containing plasma etchable material selected from the group consisting of oxygen containing plasma etchable conductor materials, oxygen containing plasma etchable semiconductor materials, and] oxygen containing plasma etchable dielectric material[s].

5. The method of claim 1 wherein the hard mask layer is formed from a hard mask material selected from the group consisting of metals, metal alloys, metal oxides, metal nitrides, non-metal oxides, non-metal nitrides and composites thereof.

6. The method of claim 1 wherein the oxygen containing etchant gas composition employs an oxygen containing etchant gas selected from the group consisting of oxygen, ozone, nitrous oxide and nitric oxide.

7. The method of claim 6 wherein the oxygen containing etchant gas composition also employs a sputtering gas component.

8. A microelectronics fabrication having formed therein a patterned oxygen containing plasma etchable microelectronics layer formed in accord with the method of claim 1.

9. A method for forming a patterned microelectronics dielectric layer within a microelectronics fabrication comprising:

providing a substrate employed within a microelectronics fabrication;

forming over the substrate an oxygen containing plasma etchable microelectronics dielectric layer;

forming upon the oxygen containing plasma etchable microelectronics dielectric layer a hard mask layer;

forming upon the hard mask layer a patterned photoresist layer;

etching through use of a first anisotropic plasma etch method the hard mask layer to form a patterned hard mask layer while employing the patterned photoresist layer as a first etch mask layer, the first anisotropic plasma etch method employing an etchant gas composition appropriate for etching a hard mask material from which is formed the hard mask layer;

etching through use of a second plasma etch method the patterned photoresist layer from the patterned hard mask layer while employing the patterned hard mask layer as an etch stop layer while simultaneously etching the oxygen containing plasma etchable microelectronics dielectric layer while employing at least the patterned hard mask layer as a second etch mask layer to form a patterned oxygen containing plasma etchable microelectronics dielectric layer, the second plasma etch method employing an oxygen containing etchant gas composition.

10. The method of claim 9 wherein a thickness of the patterned photoresist layer and a thickness of the oxygen containing plasma etchable microelectronics dielectric layer are each selected to provide that:

the patterned photoresist layer is completely etched from the patterned hard mask layer;

the oxygen containing plasma etchable microelectronics dielectric layer is completely etched to form the patterned oxygen containing plasma etchable microelectronics dielectric layer; and there is attenuated lateral etching of the patterned oxygen containing plasma etchable microelectronics dielectric layer.

11. The method of claim 9 wherein the microelectronics fabrication is selected from the group consisting of integrated circuit microelectronics fabrications, solar cell microelectronics fabrications, ceramic substrate microelectronics fabrications and flat panel display microelectronics fabrications.

12. The method of claim 9 wherein the oxygen containing plasma etchable microelectronics dielectric layer is formed from an oxygen containing plasma etchable dielectric material selected from the group consisting of organic polymer spin-on-polymer dielectric materials and amorphous carbon dielectric materials.

13. The method of claim 9 wherein the hard mask layer is formed from a hard mask material selected from the group consisting of silicon oxide hard mask materials, silicon nitride hard mask materials and silicon oxynitride hard mask materials.

14. The method of claim 9 wherein the oxygen containing etchant gas composition employs an oxygen containing etchant gas selected from the group consisting of oxygen, ozone, nitrous oxide and nitric oxide.

15. The method of claim 14 wherein the oxygen containing etchant gas composition also employs a sputtering gas component.

16. A microelectronics fabrication having formed therein a patterned oxygen containing plasma etchable microelectronics dielectric layer in accord with the method of claim 9.

*17. The method of claim 4 wherein said oxygen containing plasma etchable dielectric material is a low dielectric constant material.*

*18. The method of claim 17 wherein said low dielectric constant material is polyimide organic polymer spin-on polymer dielectric material.*

*19. The method of claim 17 wherein said low dielectric constant material is a spin-on low dielectric constant material.*

*20. The method of claim 19 wherein said spin-on low dielectric constant material is a poly (arylene ether) organic polymer spin-on polymer dielectric material.*

*21. The method of claim 19 wherein said spin-on low dielectric constant material is a fluorinated poly (arylene ether) organic polymer spin-on polymer dielectric material.*

*22. The method of claim 17 wherein said low dielectric constant material is an amorphous carbon dielectric material.*

*23. The method of claim 1 wherein the oxygen containing plasma etchable microelectronics layer is formed from an oxygen containing plasma etchable conductor material.*

*24. The method of claim 1 wherein the oxygen containing plasma etchable microelectronics layer is formed from an oxygen containing plasma etchable semiconductor material.*

*25. The method of claim 17 wherein said low dielectric constant material is a hydrogen silsesquioxane spin-on-glass dielectric material.*

*26. The method of claim 17 wherein said low dielectric constant material is a carbon bonded hydrogen silsesquioxane spin-on-glass dielectric material.*

*27. The method of claim 17 wherein said low dielectric constant material is a carbon bonded fluorocarbon silsesquioxane spin-on-glass dielectric material.*

*28. The method of claim 17 wherein said low dielectric constant material is a silsesquioxane spin-on-glass dielectric material.*

* * * * *